United States Patent
Hayakawa et al.

(10) Patent No.: US 9,243,331 B2
(45) Date of Patent: Jan. 26, 2016

(54) APPARATUS FOR PRODUCING LAMINATED BODY

(75) Inventors: Munetaka Hayakawa, Toyota (JP); Kaoru Ito, Toyota (JP); Yasuhiko Takahashi, Toyota (JP)

(73) Assignee: Kojima Press Industry Co., Ltd., Toyota-Shi (JP)

( * ) Notice: Subject to any disclaimer, the term of this patent is extended or adjusted under 35 U.S.C. 154(b) by 761 days.

(21) Appl. No.: 13/413,919

(22) Filed: Mar. 7, 2012

(65) Prior Publication Data

US 2012/0240854 A1    Sep. 27, 2012

(30) Foreign Application Priority Data

Mar. 23, 2011   (JP) .................. 2011-063462

(51) Int. Cl.
| | |
|---|---|
| C23C 14/56 | (2006.01) |
| C23C 16/54 | (2006.01) |
| B05D 1/00 | (2006.01) |
| B05D 7/04 | (2006.01) |
| B05D 7/00 | (2006.01) |
| C23C 16/04 | (2006.01) |

(52) U.S. Cl.
CPC ............... *C23C 16/545* (2013.01); *B05D 1/60* (2013.01); *B05D 7/04* (2013.01); *B05D 7/50* (2013.01); *C23C 16/042* (2013.01); *B05D 2252/02* (2013.01); *C23C 14/562* (2013.01)

(58) Field of Classification Search
CPC .................................................. C23C 14/562
USPC ................................................. 118/726, 718
See application file for complete search history.

(56) References Cited

U.S. PATENT DOCUMENTS

| | | | | |
|---|---|---|---|---|
| 5,002,837 A | * | 3/1991 | Shimogori | C23C 14/16 428/621 |
| 5,032,461 A | * | 7/1991 | Shaw | B05D 1/60 118/50.1 |

(Continued)

FOREIGN PATENT DOCUMENTS

| | | |
|---|---|---|
| CN | 1235086 A | 11/1999 |
| EP | 0 339 844 A2 | 11/1989 |

(Continued)

OTHER PUBLICATIONS

English Translation—Takahashi, Yoshikazu JP 2008287996 A.*

(Continued)

*Primary Examiner* — Gordon R Baldwin
*Assistant Examiner* — Mirza Israr Javed
(74) *Attorney, Agent, or Firm* — Burr & Brown, PLLC (57) ABSTRACT

An apparatus is provided that can stably produce a laminated body including a vapor-deposited polymer film having a predetermined composition and thickness on a film substrate. The apparatus includes: a film substrate supply means 46 that supplies a film substrate 15 on an outer peripheral surface of a rotary drum 35 in a vacuum chamber 24; a plurality of blowoff members 64 positioned around the rotary drum 35, each of the plurality of blowoff members including a vapor outlet 66 opening inside the vacuum chamber 24 to the outer peripheral surface of the rotary drum 35 and an inner space constituting a deposition chamber; and at least one monomer vapor supply means 84 arranged to supply plural kinds of monomer vapor into the deposition chamber and blowoff the plural kinds of monomer vapor from the vapor outlet of each of the plurality of blowoff members.

14 Claims, 4 Drawing Sheets

(56) References Cited

U.S. PATENT DOCUMENTS

| | | | |
|---|---|---|---|
| 6,218,004 B1* | 4/2001 | Shaw | B05D 1/60 428/195.1 |
| 2001/0003605 A1 | 6/2001 | Honda et al. | |
| 2004/0011288 A1 | 1/2004 | Affinito | |
| 2006/0159844 A1* | 7/2006 | Moriwaki et al. | 427/127 |
| 2006/0162662 A1* | 7/2006 | Sato et al. | 118/726 |
| 2006/0192964 A1* | 8/2006 | Lotz | C23C 14/54 356/429 |
| 2009/0280249 A1* | 11/2009 | Takahashi | B05D 1/34 427/255.28 |
| 2009/0280294 A1 | 11/2009 | Branca | |
| 2010/0313810 A1* | 12/2010 | Tamagaki | 118/718 |
| 2013/0302520 A1* | 11/2013 | Wang | C23C 14/243 427/255.23 |

FOREIGN PATENT DOCUMENTS

| | | | | |
|---|---|---|---|---|
| JP | 02-043042 A1 | 2/1990 | | |
| JP | 03-050709 A1 | 3/1991 | | |
| JP | 2001-261867 A1 | 9/2001 | | |
| JP | WO 2006093168 A1 * | 9/2006 | | C23C 16/509 |
| JP | 2007-308774 A1 | 11/2007 | | |
| JP | 2008-023928 A1 | 2/2008 | | |
| JP | 2008-287996 A1 | 11/2008 | | |
| JP | 2009-270134 A1 | 11/2009 | | |
| WO | 98/18852 A1 | 5/1998 | | |
| WO | 02/40598 A2 | 5/2002 | | |
| WO | 2006/093168 A1 | 9/2006 | | |

OTHER PUBLICATIONS

European Office Action (Application No. 12160451.6) dated Sep. 27, 2013.

Japanese Office Action (Application No. 2011-063462) dated May 20, 2014.

Extended European Search Report dated Jun. 25, 2012.

Chinese Office Action (Application No. 201210083679.6) dated May 5, 2014.

* cited by examiner

APPARATUS FOR PRODUCING LAMINATED BODY

The present application is based on Japanese Patent Application No. 2011-063462 filed on Mar. 23, 2011, the contents of which are incorporated herein by reference.

BACKGROUND OF THE INVENTION

1. Field of the Invention

The present invention relates to an apparatus for producing a laminated body, and more particularly to an improvement of the apparatus for producing a laminated body including a film substrate and at least one vapor-deposited polymer film deposited on the film substrate by a vacuum deposition polymerization.

2. Discussion of Related Art

Conventionally, the laminated body including a film substrate such as a resin film and a vapor-deposited polymer film formed on the film substrate by a vacuum deposition polymerization is used for various purposes. For example, the laminated body is used as a gas barrier film for preventing a permeation of oxygen gas or water vapor, or as an organic electroluminescence cell. Further, these days, it is considered that a stacked film including a metallized film and a vapor-deposited polymer film on the metallized film is used as a film capacitor element.

As an apparatus for producing such a laminated body, there are various kinds of apparatus, and one example thereof is shown in JP-A-2001-261867, for example. The apparatus disclosed in JP-A-2001-261867 includes, in a vacuum chamber thereof, a rotary drum (referred to as a cooling and coating roller therein), a feeding roller that supplies a film substrate (referred to as a substrate film therein) onto an outer peripheral surface of the rotary drum, and a pair of evaporation sources each heating and evaporating a different kind of material monomer. The apparatus is arranged to form a vapor-deposited polymer film on the film substrate by evaporating material monomers using two evaporation sources and polymerizing the two kinds of vapor monomer on the film substrate, while the film substrate unwound from the feeding roller and sent to the outer peripheral surface of the rotary drum is traveled in a circumferential direction of the rotary drum along with the rotation of the rotary drum. Such an apparatus for producing a laminated body allows the intended laminated body to be mass-produced in a continuous process.

However, in the above-described conventional apparatus, the entire of the vacuum chamber constitutes a deposition chamber. Further, only a pair of evaporation sources each containing different kind of material monomer is provided in the vacuum chamber, and two kinds of monomer vapor are supplied on the film substrate only by the pair of evaporation sources. Thus, change in pressure in the vacuum chamber (change in vacuum degree) and change in the evaporation rate of the material monomer (vapor pressure of the monomer vapor) caused by changes in the amount of material monomer remaining in the respective evaporation sources and heating temperature directly affect the composition and deposition rate of the vapor-deposited polymer film (formation rate of the vapor-deposited polymer film). As a result, the laminated bodies to be produced may have the vapor-deposited polymer films that have varied compositions and varied thickness.

In the formation of a thick vapor-deposited polymer film on the film substrate by using the conventional apparatus, the evaporation rate of the material monomer in each of the evaporation sources needs to be increased. However, in such a case, the heating temperature of the material monomer in the evaporation source is difficult to be controlled. Further, as the vapor pressure of the monomer vapor becomes high, the pressure resistance of the components of the evaporation source needs to be increased, leading to a problem of increased cost.

Further, when plural kinds of the vapor-deposited polymer film are formed on the film substrate by the above-described conventional apparatus, the vapor deposition polymerization operations need to be repeated in the same number as the number of kind of the vapor-deposited polymerization film, which is very troublesome.

JP-A-2008-287996 discloses an apparatus for producing a laminated body, which includes two sets of evaporation sources each containing a different kind of material monomers. However, the apparatus may have difficulty in maintaining a desired vapor pressure of each of monomer vapors generated by the two sets of the evaporation sources, due to the mutual interference between the two sets of the evaporation sources.

SUMMARY OF THE INVENTION

The present invention has been made in the light of the situations described above, and an object of the invention is to provide an apparatus that can stably produce a laminated body including a vapor-deposited polymer film having a predetermined composition and thickness on a film substrate, and can further easily and effectively produce a laminated body including a thick vapor-deposited polymer film or plural kinds of vapor-deposited polymer films.

To achieve the aforementioned objects, or to solve the problems understood from description throughout the present specification and drawings, the present invention may be preferably embodied according to various aspects which will be described below. Each aspect described below may be employed in any combination. It is to be understood that the aspects and technical features of the present invention are not limited to those described below, and can be recognized based on the inventive concept disclosed in the whole specification and drawings.

(1) An apparatus for producing a laminated body including a film substrate and at least one vapor-deposited polymer film deposited on the film substrate by a vacuum deposition polymerization, the apparatus comprising: (a) a vacuum chamber; (b) an exhaust means that exhausts an air from the vacuum chamber to make the vacuum chamber in a vacuum state; (c) a rotary drum that is rotatably provided in the vacuum chamber, the rotary drum having an outer peripheral surface on which the film substrate is provided so as to be in contact therewith, whereby the film substrate is allowed to be traveled in the circumferential direction along with the rotation of the rotary drum; (d) a film substrate supply means that supplies the film substrate on the outer peripheral surface of the rotary drum; (e) a plurality of blowoff members positioned around the rotary drum so as to be in line with each other in the circumferential direction, each of the plurality of blowoff members including a vapor outlet that opens inside the vacuum chamber to the outer peripheral surface of the rotary drum and an inner space that is defined by a cover wall; (f) a plurality of deposition chambers each constituted by a part of the inner space of each of the plurality of blowoff members and positioned inside the vacuum chamber; and (g) at least one monomer vapor supply means including: a plurality of evaporation sources that generate plural kinds of monomer vapor by heating and evaporating plural kinds of material monomer; and a plurality of communication passages that communicate with each of the plurality of deposition chambers, the at least one monomer vapor supply means being arranged to supply the plural kinds of monomer vapor generated in the plurality of evaporation sources into each of the plurality of deposition chambers through the plurality of communication passages, whereby the plural kinds of monomer vapor are blown off from the vapor outlet of each of the plurality of blowoff members.

(2) The apparatus according to the above aspect (1), wherein one vapor-deposited polymer film is formed by using at least two of the plurality of blowoff members.

(3) The apparatus according to the above aspect (1) or (2), wherein each of the plurality of blowoff members includes a shielding member for partially shielding the film substrate, the shielding member being provided at the vapor outlet of each of the plurality of blowoff members so as to extend across the vapor outlet in the circumferential direction of the rotary drum, thereby preventing the plural kinds of monomer vapor blown off from the vapor outlet from adhering to a portion of the film substrate that is shielded by the shielding member.

(4) The apparatus according to any one of the above aspects (1) to (3), further comprising a charging means that charges the film substrate, the charging means being provided at an upper stream side of one of the plurality of blowoff members that is positioned at the upper most stream side in a driving direction of the film substrate on the rotary drum.

(5) The apparatus according to the above aspect (4), further comprising a neutralization means that neutralizes the film substrate charged by the charging means, the neutralization means being provided at a down stream side of one of the plurality of blowoff members that is positioned at the down most stream side in a driving direction of the film substrate on the rotary drum.

(6) The apparatus according to any one of the above aspects (1) to (5), further comprising a hardening means that hardens the vapor-deposited polymer film formed on the film substrate, the hardening means being provided on the down stream side of one of the plurality of blowoff members that is positioned at the down most stream side in a driving direction of the film substrate on the rotary drum.

(7) The apparatus according to any one of the above aspects (1) to (6), wherein the film substrate has a thickness of 5 μm or less.

(8) The apparatus according to any one of the above aspects (1) to (7), wherein a distance between the vapor outlet of each of the plurality of blowoff members and the outer peripheral surface of the rotary drum is 5 mm or less.

(9) The apparatus according to any one of the above aspects (1) to (8), wherein the at least one vapor-deposited polymer film has a thickness of 10 μm or less.

(10) The apparatus according to any one of the above aspects (1) to (9), further comprising a metal vapor supply means including an evaporation source that generates metal vapor by heating and evaporating a metal deposition material and a communication passage communicating with the deposition chamber, the metal vapor supply means being arranged to supply the metal vapor generated in the evaporation source into the deposition chamber through the communication passage, whereby the metal vapor is blown off from the vapor outlet of each of the plurality of blowoff members.

(11) The apparatus according to any one of the above aspects (1) to (10), wherein the film substrate comprises a metallized film including a polypropylene based biaxially stretched film and a metal deposition film formed on at least one surface of the polypropylene based biaxially stretched film.

(12) The apparatus according to any one of the above aspects (1) to (10), wherein the film substrate comprises a metallized film including a polyethylene terephthalate based biaxially stretched film and a metal deposition film formed on at least one surface of the polyethylene terephthalate based biaxially stretched film.

(13) The apparatus according to any one of the above aspects (1) to (11), wherein the film substrate supply means comprises a feeding device, the feeding device being arranged to supply the film substrate on the outer peripheral surface of the rotary drum by unwinding the film substrate from a roll of the film substrate.

(14) The apparatus according to the above aspect (12), wherein at least one partition wall is provided in the vacuum chamber such that the vacuum chamber is separated into a first section in which the feeding device is provided and a second section in which the plurality of blowoff members are provided, thereby allowing an inner pressure of each of the sections to be changed independently.

(15) The apparatus according to any one of the above aspects (1) to (10), wherein at least one monomer vapor supply means comprises a plurality of monomer vapor supply means and the film substrate supply means comprises at least one of the plurality of monomer vapor supply means, the plural kinds of monomer vapor being supplied into at least one of the plurality of deposition chambers from the at least one of the plurality of monomer vapor supply means and blown off from the vapor outlet to be polymerized on the outer peripheral surface of the rotary drum, thereby forming the film substrate comprising a vapor-deposited polymer film substrate on the outer peripheral surface of the rotary drum.

The apparatus for producing a laminated body in accordance with the present invention can stably produce a laminated body including a vapor-deposited polymer film having a uniform composition and thickness on a film substrate. Further, it is also possible to easily and effectively produce a laminated body including a thick vapor-deposited polymer film or plural kinds of vapor-deposited polymer films at the lowest possible cost.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF THE INVENTION

To further clarify the present invention, there will be described in detail embodiments of the present invention with reference to the accompanying drawings.

Figure 1:
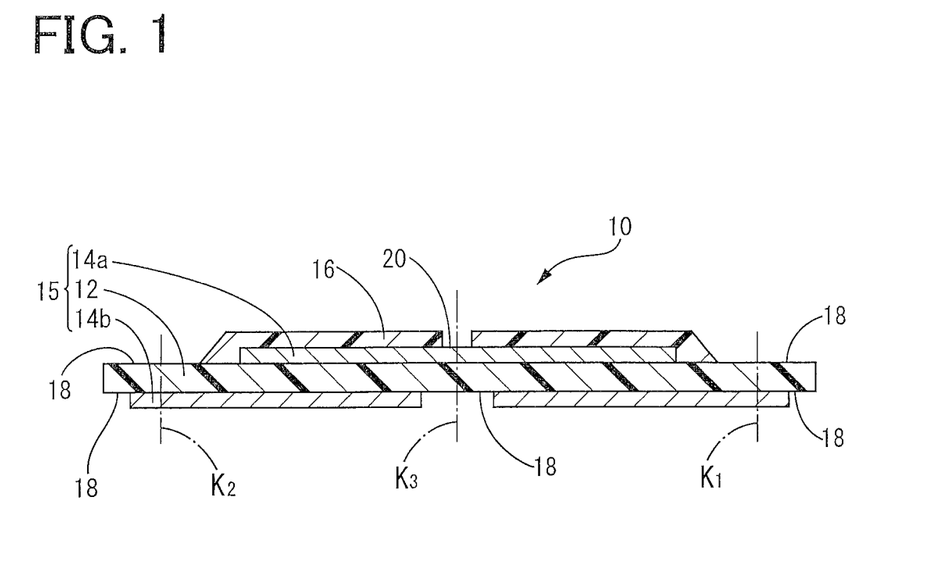
FIG. 1 is an axial cross sectional view illustrating one embodiment of a laminated body produced by an apparatus for producing a laminated body of the present invention.

Initially, FIG. 1 shows a laminated body used as a film capacitor element constituting a film capacitor, in an axial cross sectional view, as one example of a laminated body produced by an apparatus for producing a laminated body of the present invention. As apparent from FIG. 1, the laminated body 10 includes a metallized film 15 as a film substrate. The metallized film 15 includes a resin film 12, a metal deposition film 14a formed on one surface of the resin film 12, and a metal deposition film 14b formed on the other surface of the resin film 12. Further, a vapor-deposited polymer film 16 is formed on a surface of the metal deposition film 14a, which is formed on the one surface of the resin film 12, at the side opposite to the resin film 12 side.

Specifically, the resin film 12 here is formed of a biaxially stretched film made of polypropylene and has a thickness of about 1 to 10 μm. The resin film 12 constitutes a dielectric of the film capacitor that is produced using the laminated body 10. The resin film 12 may be any resin film that can constitute a dielectric of the conventional film capacitor. For example, the resin film 12 may be a biaxially stretched film made of polyethylene terephthalate, a polypropylene based biaxially stretched film such as polyphenylene sulfide based biaxially stretched resin film, a polyethylene naphtalate based biaxially stretched resin film, and a polyvinylidene fluroride resin film. Further, it is to be understood that the resin film 12 may be a uniaxially stretched resin film or non-stretched resin film depending on the application of the laminated body 10.

Here, the metal deposition films 14a, 14b are made of aluminum. The metal deposition films 14a, 14b each constituting an internal electrode of the film capacitor produced using the laminated body 10 is formed on the respective surfaces of the resin film 12. Specifically, the metal deposition films 14a, 14b are formed on the respective surfaces of the resin film 12 by a conventionally known vacuum deposition process that is in the same category as PVD and CVD by using a conventionally known metal material that forms the internal electrode of the film capacitor (for example, aluminum and zinc) as a deposition material. Membrane resistance of the metal deposition films 14a, 14b is adjusted to about 1 to 50 $\Omega/cm^2$ and the thickness thereof is suitably determined depending on the membrane resistance, for example. It is to be understood that metal materials other than aluminum and zinc may be used as the formation material of the metal deposition films 14a, 14b depending on the application of the laminated body 10.

Here, each surface of the resin film 12 includes an area where the metal deposition films 14a, 14b are not formed over the entire length of the resin film 12 at each end in the width direction (right and left direction in FIG. 1) of the resin film 12. Further, the surface of the resin film 12 on which the metal deposition film 14b is formed includes an area where the metal film deposition film 14b is not formed over the entire length of the resin film at a middle area in the width direction of the resin film 12. The areas of the resin film 12 where the metal deposition film is not formed are each referred to as a first margin 18.

The vapor-deposited polymer film 16 constitutes a dielectric of the film capacitor, which is produced by using the laminated body 10, with the resin film 12, and is formed on the metal deposition film 14a by a known vacuum deposition polymerization. The vapor-deposited polymer film 16 formed by the known vacuum deposition polymerization has a sufficiently smaller thickness and higher dielectric constant than the resin film 12. As a result, the entire thickness of the laminated body 10 can be advantageously made smaller, and the film capacitor produced by using the laminated body 10 can have a smaller size and increased capacity.

Although the thickness of the vapor-deposited polymer film 16 is not particularly limited, it is preferable that the thickness thereof be about 0.001 to 10 μm. It is difficult to form the vapor-deposited polymer film 16 having a thickness of less than 0.001 μm. Thus, it is practical that the thickness of the vapor-deposited polymer film 16 is 0.001 μm or more. Further, if the thickness of the vapor-deposited polymer film 16 is more than 10 μm, it is difficult that the film capacitor including the vapor-deposited polymer film 16 as the dielectric has a smaller size and increased capacity.

A kind of the vapor-deposited polymer film 16 is not particularly limited as long as it is a resin film that can be formed by a vacuum deposition process. Examples of the resin film that constitutes the vapor-deposited polymer film 16 include a polyurea resin film, a polyamide resin film, a polyimide resin film, a polyamideimide resin film, a polyester resin film, a polyazomethine resin film, and a polyurethane resin film. Among the above listed resin films, one having a higher dielectric constant than the resin film 12 is favorably employed. The capacitance of the film capacitor can be effectively increased by the formation of the vapor-deposited polymer film 16 using such a resin film.

Of the above listed resin films, the polyurea resin film is favorably used to form the vapor-deposited polymer film 16. This is because that the polyurea resin secures the higher dielectric constant than the resin film 12 and requires no heat treatment in the polymerization of monomers (diisocyanate and diamine). Further, the polyurea resin is formed in the addition polymerization reaction which is free from elimination of water, alcohol and the like. Consequently, equipments (facilities) for heat treatment in the polymerization of monomers is not necessary and cost can be reduced. Further, deformation of the resin film 12 by the heat generated during the heat treatment can be effectively avoided. Furthermore, there is no need to remove water, alcohol, and the like, which are eliminated during the polymerization reaction, from the vacuum chamber in which the polymerization reaction proceeds. Therefore, equipments for removing the eliminated water or alcohol are not necessary, which also resulting in the reduction of the cost. In addition, the polyurea resin has excellent heat resistance. As a result, the high withstand voltage of the vapor-deposited polymer film 16 can be stably secured.

At the middle area in the width direction of the resin film 12, the vapor-deposited polymer film 16 is not formed over the entire length of the resin film 12. The area of the resin film 12 where the vapor-deposited polymer film 16 is not formed is referred to as a second margin 20, at which the middle area in the width direction of the metal deposition film 14a is exposed. Further, the width of the vapor-deposited polymer film 16 is larger than that of the metal deposition film 14a. As a result, each side surface in the width direction of the metal deposition film 14a is covered by each end portion in the width direction of the vapor-deposited polymer film 16.

In the production of the film capacitor element using the laminated body 10 having the above-described structure, initially, each end portion in the width direction of the laminated body 10 is cut along a cut plane $K_1$, $K_2$, each extending in the longitudinal direction. As a result, end portions in the width direction of the resin film 12 and end portions in the width direction of the metal deposition film 14b are cut away. Further, the laminated body 10 is cut along a cut plane $K_3$ extending in a longitudinal direction (a direction perpendicular to the sheet in FIG. 1) at the middle in the width direction (right and left direction in FIG. 1), thereby being divided into two.

Then, two laminated bodies 10, 10, which are obtained by dividing the laminated body 10 into two and whose end portions in the width direction of the laminated body 10 are cut away, are stacked such that the metal deposition film 14b and the vapor-deposited polymer film 16 are overlapped with each other, after one of two laminated bodies 10, 10 (for example, one positioned at the left side of the cut plane $K_3$ in FIG. 1) is horizontally flipped. Accordingly, a stacked type film capacitor element is obtained. Subsequently, although not shown in the drawings, an external electrode is formed on each end surface in the width direction of the film capacitor element by a known process. The external electrode on one end surface in the width direction of the film capacitor element (the end surface positioned at the cut plane $K_3$ side in FIG. 1) adheres to the end surface of the metal deposition film 14a at the second margin 20 side (at the cut plane $K_3$ side in FIG. 1). Further, the external electrode on the other end surface in the width direction of the film capacitor element (the end surface positioned at the cut plane $K_1$ side in FIG. 1) adheres to the end surface of the metal deposition film 14b at the side opposite to the first margin 18 side (at the cut plane $K_1$ side in FIG. 1). Then, as necessary, an external terminal is connected to each of the external electrodes and thus obtained film capacitor element is sealed in a predetermined case to obtain the stacked type film capacitor. In the production of such a stacked film capacitor element or film capacitor, three or more of the above-described laminated body 10 that is divided into two may be stacked.

Further, it is also possible to obtain a wound film capacitor element by winding a single divided laminated body 10 or a plurality of divided laminated bodies 10 that are stacked with each other. An external electrode is formed on each surface in the width direction of the wound film capacitor element by a conventional process, and then the wound film capacitor element is contained in a predetermined case, after an external terminal is connected to each of the external electrode as necessary, thereby obtaining a wound film capacitor.

Figure 2:
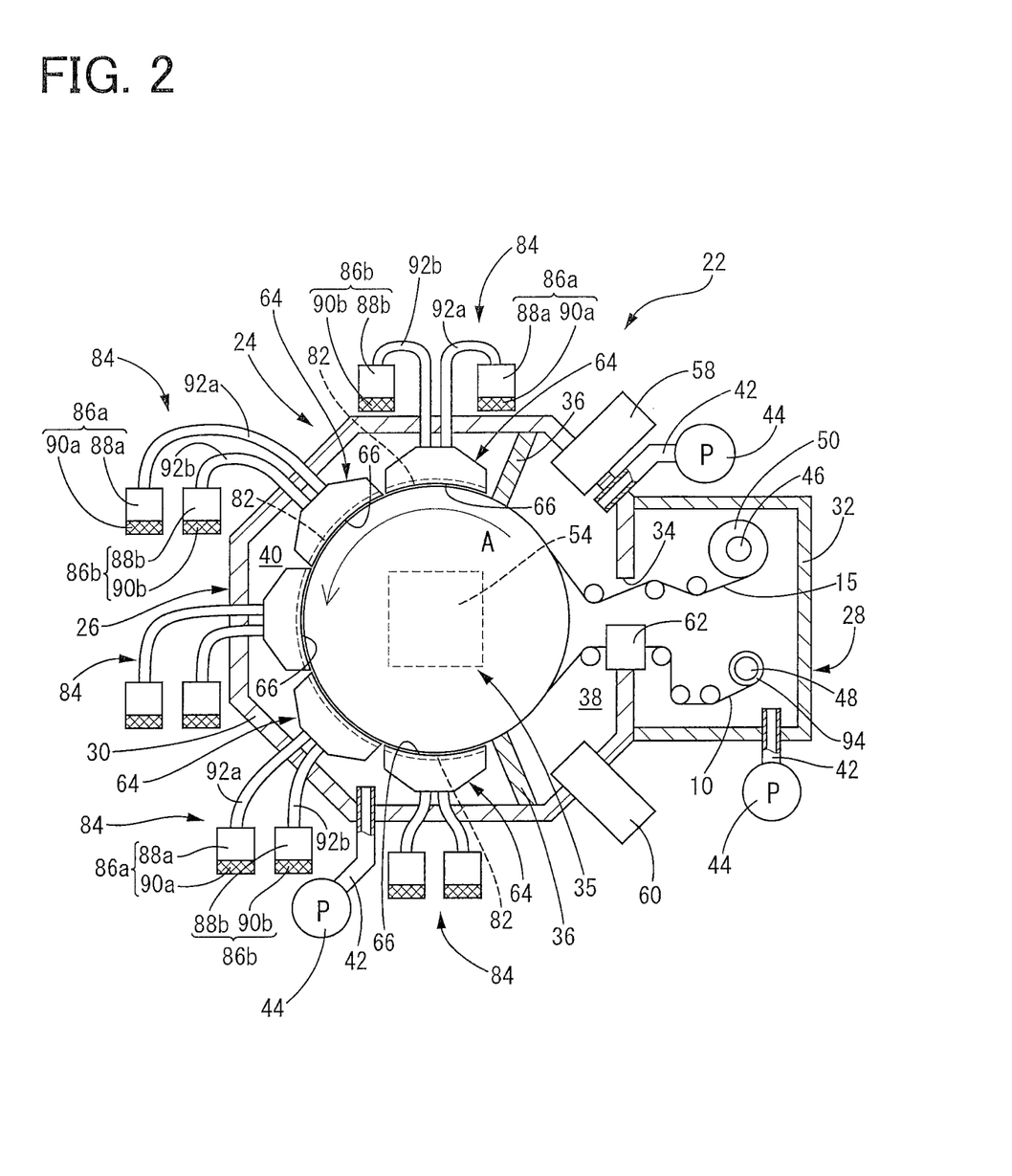
FIG. 2 is a view schematically showing an embodiment of an apparatus for producing a laminated body of the present invention.

The above-described laminated body 10 is produced by a production apparatus 22 of the present invention shown in FIG. 2, for example. Hereinafter, the production apparatus 22 of the laminated body in accordance with a first embodiment of the present invention will be described in detail.

As apparent from FIG. 2, the production apparatus 22 in accordance with the present embodiment includes a vacuum chamber 24 having a predetermined size. The vacuum chamber 24 includes a main chamber 26 and an auxiliary chamber 28. The main chamber 26 is surrounded by a first peripheral wall 30. The auxiliary chamber 28 is surrounded by a part of the first peripheral wall 30 and a second peripheral wall 32. The main chamber 26 and the auxiliary chamber 28 are communicated with each other through a window 34 that is formed at the part of the first peripheral wall 30, which surrounds the auxiliary chamber 28 with the second peripheral wall 32.

At the center in the main chamber 26, a can roller 35 as a rotary drum is rotatably provided. Further, in the main chamber 26, two partition walls 36, 36 are provided so as to extend from an inner surface of the first peripheral wall 30 to the can roller 35. Thus, an inner space of the main chamber 26 surrounding the can roller 35 is divided into two by the two partition walls 36, 36. As a result, a first vacuum section 38 and a second vacuum section 40 are defined around the can roller 35 in the main chamber 26.

Further, exhaust pipes 42, 42, 42 are each connected to the first vacuum section 38, the second vacuum section 40 of the main chamber 26, and the auxiliary chamber 28. To each of the exhaust pipes 42, 42, 42, each of vacuum pumps 44, 44, 44 is connected. By the operation of the vacuum pumps 44, 44, 44, the inside of each of the first vacuum section 38, the second vacuum section 40, and the auxiliary chamber 28 is made to be in a vacuum state. Here, the vacuum pumps 44, 44, 44 are configured to be controlled separately. Thus, the vacuum degree of the first vacuum section 38 can be controlled to be lower than that of the second vacuum section 40 and the auxiliary chamber 28. As apparent from this, in the present embodiment, the exhaust pipes 42, 42, 42 and the vacuum pumps 44, 44, 44 constitute an exhaust means.

In the auxiliary chamber 28, a feeding roller 46 as a feeding device and a take up roller 48 as a take up device are provided with a predetermined distance therebetween so as to be rotated around their rotation axes that are parallel to a rotation axis of the can roller 35. On the feeding roller 46, a film roll 50 of the above-described metallized film 15 including the resin film 12 and the metal deposition films 14a, 14b formed on each surface of the resin film 12 is fitted, and the film roll 50 is unwound by the rotation of the feeding roller 46. On the take up roller 48, a tip end portion of the metallized film 15 that is unwound from the film roll 50 by the feeding roller 46 is wound in a removable manner. The take up roller 48 is rotationally driven by an electric motor (not shown), for example. By this arrangement, the metallized film 15 that is unwound from the film roll 50 is taken up by the take up roller 48 with the rotational drive of the take up roller 48, after the vapor-deposited polymer film 16 is formed on the metallized film 15 to obtain the laminated body 10, as will be described later.

The can roller 35 in the main chamber 26 is formed of a cylindrical body made of metal such as iron, and positioned in both of the first vacuum section 38 and the second vacuum section 40. Specifically, the can roller 35 is provided in the main chamber 26 such that a large part of the outer peripheral surface of the can roller 35 is exposed to the second vacuum section 40 and the other part thereof is exposed to the first vacuum section 38.

The can roller 35 is rotationally driven in one direction (direction indicated by an arrow A in FIG. 2), by an electric motor (not shown), for example. Here, a surface roughness (Rz) of the outer peripheral surface of the can roller 35 is arranged to be preferably in a range of about 0.6 to 2.0 μm. As a result, the metallized film 15 wound on the can roller 35 is prevented from having wrinkles at the maximum extent possible during driving along with the rotation of the can roller 35.

The can roller 35 is in an electrically insulated state by a conventional structure. In the inside of the can roller 35, a cooling mechanism 54 is provided. The cooling mechanism 54 has a known structure for cooling the outer peripheral surface of the can roller 35 by a circulation of a cooling medium, for example.

Then, the metallized film 15 that is unwound from the film roll 50 fitted on the feeding roller 46 is sent into the main chamber 26 (the first vacuum section 38) from the auxiliary chamber 28 through the window 34, and wound on the can roller 35. Then, the tip end portion of the metallized film 15 wound on the can roller 35 is sent back into the auxiliary chamber 28 from the main chamber 26 (the first vacuum section 38) through the window 34, and wound on the take up roller 48.

Accordingly, the metallized film 15 unwound from the film roll 50 is traveled in a rotation direction of the can roller 35 (direction indicated by the arrow A in FIG. 2) with the rotational drive of the can roller 35 and the take up roller 48 while being contacted with the outer peripheral surface of the can roller 35. Further, the metallized film 15 wound on the can roller 35 is cooled through the contact with the outer peripheral surface of the can roller 35 that is cooled by the cooling mechanism 54. Here, the traveling speed of the metallized film 15 by the rotational driving of the can roller 35 and the take up speed of the metallized film 15 by the rotational driving of the take up roller 48 are controlled to be the same. As apparent from this, in the present embodiment, the feeding roller 46 and the take up roller 48 constitute a film substrate supply means.

At a part of the first peripheral wall 30 which constitutes the first vacuum section 38 of the main chamber 26, an electron beam gun for charging 58 and an electron beam gun for hardening 60 are separately provided.

The electron beam gun for charging 58 is positioned such that an electron irradiation part thereof faces towards a part of the outer peripheral surface of the can roller 35 that is exposed to the first vacuum section 38 and positioned at an upstream side in the traveling direction of the metallized film 15. By this arrangement, the electron beam emitted from the electron beam gun for charging 58 is irradiated onto the metallized film 15 that is unwound from the film roll 50 and wound on the can roller 35. Accordingly, the metallized film 15 is negatively charged before being entered into the second vacuum section 40. As a result, the metallized film 15 wound on the can roller 35 is in close contact with the outer peripheral surface of the can roller 35 due to potential difference between the metallized film 15 and the can roller 35.

On the other hand, the electron beam gun for hardening 60 is positioned such that an electron irradiation part thereof faces towards a portion of the outer peripheral surface of the can roller 36 that is exposed to the first vacuum section 38 and positioned at an downstream side in the traveling direction of the metallized film 15. By this arrangement, the electron beam emitted from the electron beam gun for hardening 60 is irradiated onto the metallized film 15 (laminated body 10) that is traveled in one direction of the can roller 35, before the metallized film 15 is taken up by the take up roller 48. Then, the vapor-deposited polymer film 16 that is formed on the metallized film 15 by a vapor deposition polymerization operation, which will be described later, is quickly hardened by the irradiation of the electron beam.

At the window 34, which communicates through the main chamber 26 and the auxiliary chamber 28, an ion bombardment treatment device 62 as a neutralization means is provided. The ion bombardment treatment device 62 is arranged such that the metallized film 15 (the laminated body 10) can be passed therethrough before being taken up by the take up roller 48. By a known structure, plasmatized argon gas is brought into collision with the metallized film 15 passing therethrough. Accordingly, the metallized film 15 that is charged by the electron beam gun for charging 58 is neutralized.

Figure 3:
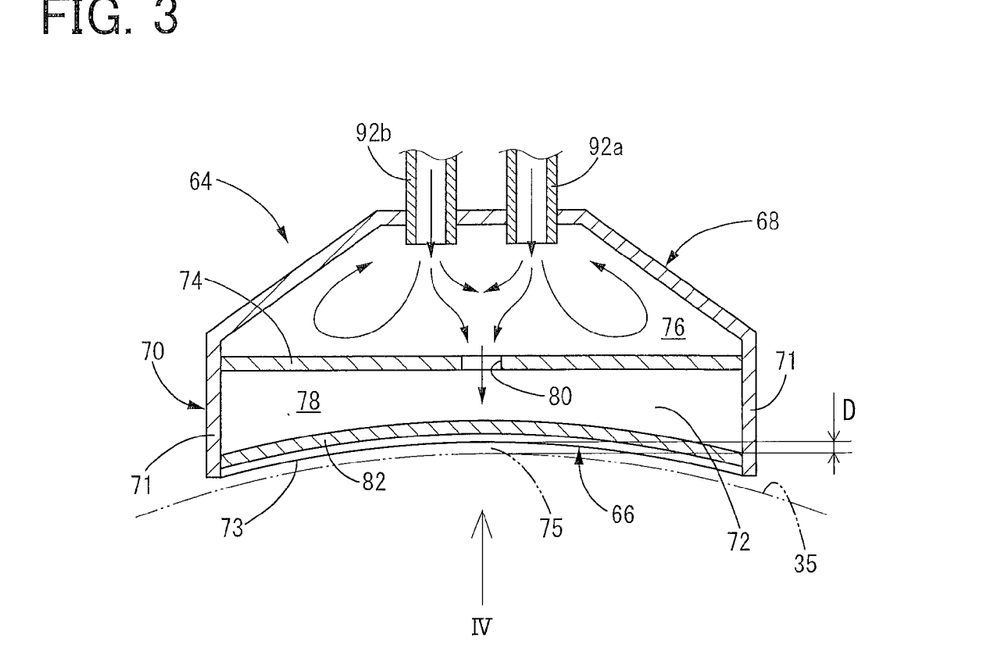
FIG. 3 is an axial cross sectional view illustrating an inner space of a blowoff member shown in FIG. 2.
Figure 4:
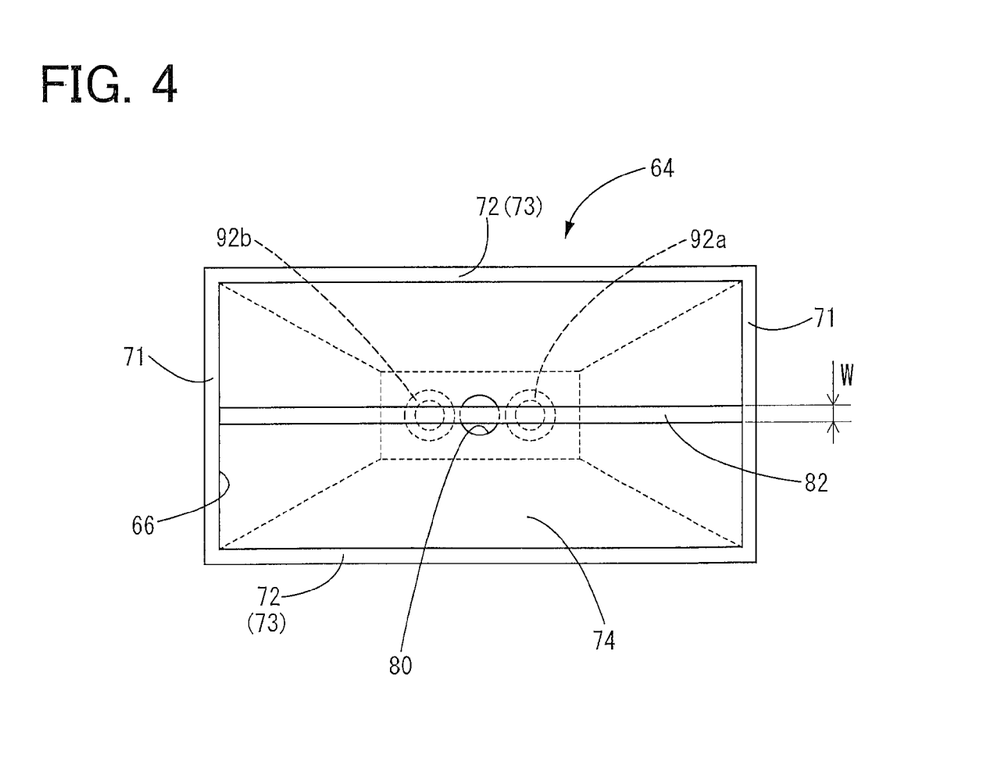
FIG. 4 is an explanation view viewed from a direction of arrow IV in FIG. 3.

In the second vacuum section 40 of the main chamber 26, a plurality of blowoff members 64 (here, five) are positioned around the can roller 35 so as to be in line in the circumferential direction thereof. As shown in FIG. 3 and FIG. 4, the blowoff member 64 is formed of a cylindrical body opening towards downward (downward in FIG. 3) and having a bottom at one side. The opening toward downward is referred to as a vapor outlet 66. The blowoff member 64 includes an upper cylindrical portion 68 and a lower cylindrical portion 70. The upper cylindrical portion 68 has a quadrangular pyramid shape whose cross sectional is gradually increased toward a lower side, and the lower cylindrical portion 70 has a horizontally long cuboid shape. The upper cylindrical portion 68 and the lower cylindrical portion 70 constitute a cover wall of the blowoff member.

The lower cylindrical portion 70 has two first side walls 71, 71 that extend in a width direction of the lower cylindrical portion 70 (the direction perpendicular to the sheet in FIG. 3 and the up and down direction in FIG. 4) and two second side walls 72, 72 that extend in a longitudinal direction of the lower cylindrical portion 70 (right and left direction in FIGS. 3 and 4). Each of the first side walls 71, 71 has a flat lower end surface and each of the second side walls 72, 72 has an arc shaped lower surface 73 that protrudes upwards. The diameter of the arc shaped surface 73 of the second side wall 72 is made slightly larger than the diameter of the outer peripheral surface of the can roller 35 (indicated by a two-dot chain line in FIG. 3.) Accordingly, a distance between the lower surface of the lower cylindrical portion 70 of the blowoff member 64 and the outer peripheral surface of the can roller 35 is made to be substantially constant over the entire circumferential length of the lower cylindrical portion 70. Specifically, a gap 75 formed between the vapor outlet 66 and the outer peripheral surface of the can roller 35 has a substantially constant size over the entire circumferential length of the vapor outlet 66.

Here, the size of the gap 75 between the vapor outlet 66 and the outer peripheral surface of the can roller 35, i.e., the distance between the lower surface including the arc shaped lower surface 73, 73 of the lower cylindrical portion 70 and the outer peripheral surface of the can roller 35 (diameter indicated by D in FIG. 3) is preferably not to be more than 5 mm. Thus, the gap 75 between the vapor outlet 66 and the outer peripheral surface 35 of the can roller 35 is sufficiently made small.

At an upper end side of the lower cylindrical portion 70, an intervening wall 74 is provided to divide the inner space of the blowoff member 64 into upper and lower spaces. By the intervening wall 74, an inner space portion positioned upper than the intervening wall 74 is made as a mixing chamber 76 and an inner space portion positioned lower than the intervening wall 74 is made as a deposition chamber 78. Further, at the middle portion of the intervening wall 74, a communication hole 80 is provided so as to penetrate therethrough. As a result, the mixing chamber 76 and the deposition chamber 78 are communicated with each other through the communication hole 80.

Further, at the vapor outlet 66 of the blowoff member 64, a shield bar 82 as a shielding member is provided. The shield bar 82 is formed of a curved plate that has an inner diameter substantially equal to the diameter of the arc shaped lower surface 73 of the lower cylindrical portion 70 and a chord substantially equal to the distance between the opposing surfaces of the two first side walls 71, 71. Then, the shield bar 82 is positioned at the middle in the width direction of the lower cylindrical portion 70 so as to extend in the longitudinal direction and fixed at the lower end portion of the opposing surfaces of the two first side walls 71, 71.

As will be described later, the shield bar 82 is provided to form the second margin 20 on the vapor-deposited polymer film 16 formed on the metallized film 15 by the vapor deposition polymerization operation. Accordingly, here, the width of the shield bar 82 (a dimension indicated by W in FIG. 4) is generally made to be about 1 to 20 mm, so as to correspond to the width of the second margin 20.

Then, as shown in FIG. 2 and FIG. 3, The plurality of blowoff members 64 having the above-described structure, which are positioned in the second vacuum section 40 of the main chamber 26 so as to be in line in the circumferential direction of the can roller 35, are fixed at the first peripheral wall 30 or the like while the vapor outlet 66 is opened to the outer peripheral surface of the can roller 35 and the arc shaped lower surface 73, 73 of the lower cylindrical portion 70 are extended along the outer peripheral surface of the can roller 35. By this arrangement, the shield bar 82 provided at the respective blowoff members 64 is positioned such that the shield bar 82 extends across the vapor outlet 66 in the circumferential direction of the can roller 35.

At the outside of the vacuum chamber 24, a plurality of monomer vapor suppliers 84 as a monomer vapor supply means are provided in the same number as the blowoff members 64 (here, five). All of the monomer vapor suppliers 84 have the same structure and include a first evaporation source 86a and a second evaporation source 86b. The first evaporation source 86a includes a first monomer pot 88a containing one of two material monomers that form the vapor-deposited polymer film 16 in a liquid form and a first heater 90a for heating and evaporating the material monomer in the first monomer pot 88a. The second evaporation source 86b includes a second monomer pot 88b containing the other one of two material monomers in a liquid form and a second heater 90b for heating and evaporating the material monomer in the second monomer pot 88b.

In the present embodiment, since the vapor-deposited polymer film 16 is formed of a polyurea resin film, a predetermined amount of diisocyanate is contained in the first monomer pot 88a and a predetermined amount of diamine is contained in the second monomer pot 88b. Further, each of the first and second heaters 90a, 90b is constituted by an electric heater. In the case where the vapor-deposited polymer film 16 is formed of a resin film other than the polyurea resin film, a material monomer other than diisocyanate and diamine is contained in each of the first and second monomer pots 88a, 88b, depending on the kind of resin film constituting the vapor-deposited polymer film 16. The first and second heaters 90a, 90b may be constituted by a known heater other than the electric heater, for example, an infrared heater or an electron irradiation heater. Further, three or more evaporation sources may be used when the resin film constituting the vapor-deposited polymer film 16 is formed through the polymerization of three or more kinds of the material monomers or when the vapor-deposited polymer film 16 is constituted by a polyurea resin film that is obtained by using material monomers including one or more kinds of diisocyanate and diamine.

To one end of the first monomer pot 88a of the first evaporation source 86a, a first monomer vapor supply pipe 92a as a communication passage is connected so as to communicate with each other. Further, at one end of the second monomer pot 88b of the second evaporation source 86b, a second monomer vapor supply pipe 92b as a communication passage is connected so as to communicate with each other. As apparent from FIG. 2 to FIG. 4, the first and second monomer vapor supply pipes 92a, 92b are connected to the blowoff member 64 at the other end thereof so as to communicate with the mixing chamber 76 of the blowoff member 64. Thus, the respective monomer vapor suppliers 84 and the respective blowoff members 64 are connected to each other such that the inner space of the first and second monomer pots 88a, 88b and the mixing chamber 76 are communicated with each other.

Each of diisocyanate and diamine contained in the first monomer pot 88a and the second monomer pot 88b of the monomer vapor suppliers 84 are heated by each of the first and second heaters 90a, 90b and evaporated to be monomer vapor. Then, the monomer vapor is supplied to the mixing chamber of the respective blowoff members 64 through the first and second monomer vapor supply pipes 92a, 92b. After the diisocyanate vapor and diamine vapor are mixed uniformly in the mixing chamber 76, the mixed gas is introduced into the deposition chamber 78 through the through hole 80 of the intervening wall 74. Then, the mixed gas of the diisocyanate vapor and the diamine vapor is blown off from the vapor outlet 66 onto the outer peripheral surface of the can roller 35 in the second vacuum section 40.

Heating temperature of the first and second heaters 90a, 90b of the respective monomer vapor suppliers 84 can be controlled independently. Thus, vapor pressure of the monomer vapor that is blown off from the vapor outlet 66 of the respective blowoff members 64 connected to the respective monomer vapor suppliers 84 can be controlled for each of the blowoff members 64 (each of the monomer vapor suppliers 84.)

In the production of the laminated body shown in FIG. 1 with the production apparatus 22 having the above-described structure, the following procedure is conducted, for example.

Initially, as shown in FIG. 2, the film roll 50 is externally fitted on the feeding roller 46. Then, the metallized film 15 is unwound from the film roll 50 and wound on the can roller 35, and a tip end portion of the metallized film 15 is wound on the take up roller 48. The metallized film 15 sent from the can roller 35 is arranged to pass through the ion bombardment treatment device 62 before being taken up by the take up roller 48.

Preferably, the metallized film 15 constituting the film roll 50 has a thickness of 5 μm or less. Specifically, it is preferable that the total thickness of the resin film 12 and the metal deposition films 14a, 14b formed on each surface of the resin film 12 be 5 μm or less. Due to this thickness, the thickness of the laminated body 10 that is obtained can be sufficiently small, specifically, about 10 μm or less.

At the same time as the metallized film 15 is wound on the can roller 35, or before or after such an operation, the cooling mechanism 54 built-in the can roller 35 is activated to cool the outer peripheral surface of the can roller 35, thereby cooling the metallized film 15 wound on the can roller 35. As long as the vapor-deposition polymerization operation, which will be described later, is stably performed on the metallized film 15, the temperature of the metallized film 15 cooled by the cooling mechanism 54 is not particularly limited. Generally, the temperature is about −15 to 40° C.

After the metallized film 15 is wound on the can roller 35, three vacuum pumps 44, 44, 44 are activated to reduce the pressure in the first and second vacuum sections 38, 40 of the main chamber 26 and the auxiliary chamber 28 such that they are in a vacuum state. The pressures in the second vacuum section 40 and the auxiliary chamber 28 are adjusted to about $10^{-4}$ to 100 Pa. Further, the pressure in the first vacuum section 38 is adjusted to a lower pressure than the second vacuum section 40 and the auxiliary chamber 28, for example about $10^{-4}$ to 10 Pa.

Then, an electric motor is rotationally driven to rotate the can roller 35 in the direction indicated by the arrow A in FIG. 2. At the same time, the take up roller 48 is rotationally driven. As a result, the metallized film 15 sent from the can roller 35 can be taken up by the take up roller 48, while the metallized film 15 is sent from the film roll 50 in the auxiliary chamber 28 into the main chamber 26 and traveled in the direction indicated by the arrow A.

Simultaneously with the start of the rotation of the can roller 35, the electron beam gun for charging 58 is activated to irradiate the electron beam onto the metallized film 15 wound on the can roller 35. As a result, the surface of the metallized film 15 is negatively charged. Thus, the metallized film 15 traveling along with the rotation of the can roller 35 is in close contact with the outer peripheral surface of the can roller 35.

Here, since the pressure in the first vacuum section 38 is adjusted to be lower than the pressure in the second vacuum section 40, the surface of the metallized film 15 is effectively charged by the electron beam irradiation with the electron beam gun for charging 58. However, the pressure in the second vacuum section 40 may be made lower than the first vacuum section 38. In such a case, during the operation of the vacuum vapor deposition polymerization operation, which will be described later, the material monomer is prevented from entering into the first vacuum section 38 from the second vacuum section 40. As a result, the adhesion of the material monomer or the vapor-deposited polymer film 16 to the inner surface of the first vacuum section 38 is prevented. Consequently, there is no need to remove the material monomer or the vapor-deposited polymer film 16 from the first vacuum section 38.

In the case where the metallized film 15 is charged as above, the charge built up on the metallized film 15 do not escape through the can roller 35 because the can roller 35 is in an electrically insulated state. Further, the surface of the metallized film 15 is efficiently and surely charged by the electron beam irradiation, because the vacuum degree of the inside of the first vacuum section 38 is made sufficiently low. Further, by the partition walls 36, the first vacuum section 38 is separated from the second vacuum section 40 where the blowoff members 64 each including the vapor outlet 66 are disposed. Thus, it can be advantageously prevented that the inner pressure of the first vacuum section 38 is increased by the inner pressure of the second vacuum section 40 increased by the mixed gas of the diisocyanate vapor and diamine vapor inevitably leaking from the gap between the vapor outlet 66 and the outer peripheral surface of the can roller 35, in the vapor deposition polymerization operation, which will be described later. As a result, the low vacuum degree of the inside of the first vacuum section 38 is sufficiently maintained, so that the metallized film 15 is more surely and stably charged in the first vacuum section 38 by the electron beam irradiation.

Then, while the metallized film 15 is traveled, diisocyanate in the first monomer pot 88a of the first evaporation source 86a of the monomer vapor suppliers 84 is heated with the first heater 90a and evaporated to generate the diisocyanate vapor. Further, at the same time, the diamine in the second monomer pot 88b of the second evaporation source 86b is heated with the second heater 90b and evaporated to generate the diamine vapor.

Each of the first heaters 90a is controlled such that the diisocyanate in each of the first monomer pots 88a of the monomer vapor suppliers 84 is heated to the same temperature. Further, each of the second heaters 90b is controlled such that the diamine in each of the second monomer ports 88b of the monomer vapor suppliers 84 is heated to the same temperature. Thus, the vapor pressure of the diisocyanate vapor generated in each of the first evaporation sources 86a of the monomer vapor suppliers 84 is controlled to be equal. Further, the vapor pressure of the diamine vapor generated in each of the second evaporation sources 86b of the monomer vapor suppliers 84 is controlled to be equal. In addition, by the above control, the evaporation rate of the diisocyanate in each of the first evaporation source 86a of the monomer vapor suppliers 84 is controlled to be equal. Further, the evaporation rate of the diamine in the second evaporation source 86b of the monomer vapor suppliers 84 is controlled to be equal.

Each of the diisocyanate vapor and the diamine vapor generated in the first and second evaporation sources 86a, 86b of the monomer vapor suppliers 84 is introduced into the respective mixing chamber 76 of the blowoff members 64 through the first and second monomer vapor supply pipes 92a, 92b. The diisocyanate vapor and the diamine vapor are equally mixed therein and introduced into the deposition chamber 78. Then, the mixed gas of the diisocyanate vapor and the diamine vapor is blown off through the vapor outlet 66 onto the metallized film 15 traveling on the outer peripheral surface of the can roller 35 while being in a close contact therewith.

The diisocyanate vapor and the diamine vapor blown off from each of the vapor outlets 66 of the blowoff members 64 are deposited on the metallized film 15 and polymerized thereon. As a result, the vapor-deposited polymer film 16 formed of a polyurea resin film is simultaneously formed on plural parts of the outer peripheral surface of the metallized film 15. Thus, the laminated body 10 is obtained. The vapor-deposited polymer film 16 of the laminated body 10 is constituted by a laminate of polymerized products (polyurea resin films) obtained by the polymerization of the diisocyanate vapor and the diamine vapor blown off from the vapor outlets 66 of the blowoff members 64.

The distance between the two second side walls 72, 72 which are opposed to each other in the width direction of the blowoff member 64 (the dimension corresponding to the width direction of the outer peripheral surface of the can roller 35) is larger than the width of the metal deposition film 14a formed on the resin film 12 by a predetermined dimension. Thus, the width of the vapor-deposited polymer film 16 formed by the vapor deposition polymerization operation is made to be larger than the width of the metal deposition film 14a, thereby covering both end faces in the width direction of the metal deposition film 14a by both end portions in the width direction of the vapor-deposited polymer film 16.

Further, in a state where the metallized film 15 is wound on the can roller 35 in close contact with the outer peripheral surface thereof, the shield bar 82 arranged to extend across the vapor outlet 66 of the blowoff member 64 in the circumferential direction of the can roller 35 is positioned so as to oppose to the middle area in the width direction of the metallized film 15 with the gap 75 therebetween. In other words, the shield bar 82 is positioned so as to cover the middle area in the width direction of the metallized film 15 with a small distance therebetween.

By the shield bar 82, the diisocyanate vapor and diamine vapor blown off from the vapor outlet 66 of the respective blowoff members 64 are prevented from being deposited on the middle area in the width direction of the metallized film 15. Thus, the polymerization reaction of the diisocyanate vapor and diamine vapor is hardly caused on the middle area in the width direction of the metallized film 15. As a result, on the middle area in the width direction of the metallized film 15, the vapor-deposited polymer film 16 consisting of the polyurea resin film is not formed. Consequently, the second margin 20 is formed on the middle area in the width direction of the metallized film 15, where the vapor-deposited polymer film 16 is not formed.

Here, as described above, the dimension D of the gap 75 between the vapor outlet 66 of each of the blowoff members 64 and the outer peripheral surface of the can roller 35 is 5 mm or less over the entire circumferential length of the vapor outlet 66. Thus, it is prevented at the maximum extent possible that the mixed gas of the diisocyanate vapor and the diamine vapor is escaped to the outside (into the second vacuum section) from the deposition chamber 78 of the respective blowoff members 64 through the gap 75. Thus, it is effectively prevented that the diisocyanate vapor and diamine vapor are deposited on the other parts of the outer peripheral surface of the can roller 35 than the metallized film 15, resulting in the efficient use of the diisocyanate vapor and diamine vapor in the vapor deposition polymerization operation. Consequently, the deposition rate of the vapor-deposited polymer film 16 is advantageously improved.

As described above, the vapor deposition polymerization of the diisocyanate vapor and diamine vapor is simultaneously carried out on the plural parts of the outer peripheral surface of the metallized film 15 to which the vapor outlet 66 of each of the plurality of blowoff members 64 opens. Specifically, the vapor-deposited polymer film 16 is simultaneously formed by the vapor deposition polymerization of the diisocyanate vapor and diamine vapor in each of the deposition chambers 78 of the blowoff members 64. Each of the deposition chambers 78 is surrounded by the lower cylindrical portion 70 and the intervening wall 74, and separated from the second vacuum section 40.

Therefore, in the second vacuum section 40, which is in a vacuum state, the inner pressure of each of the deposition chambers 78 can be changed independently of the second vacuum section 40 by the supply of the diisocyanate vapor and diamine vapor. Further, it can be effectively eliminated or suppressed that the vapor pressure of the diisocyanate vapor and the diamine vapor in the respective deposition chambers 78 is changed due to the change in the pressure of the second vacuum section 40. Accordingly, it can be prevented to the maximum extent possible that the evaporation rate of the diisocyanate and the diamine in the first and second evaporation sources 86a, 86b that communicate with the respective deposition chambers 78 is changed due to the pressure variation in the second vacuum section 40.

That is, it can be effectively prevented that the deposition rate and the composition of the vapor-deposited polymer film 16 formed on the plural portions of the metallized film 15 is changed in the respective deposition chambers 78 due to the pressure variation in the second vacuum section 40.

Further, the deposition chambers 78 of the blowoff members 64 are not directly communicated with each other. The deposition chambers 78 are indirectly communicated with each other via the second vacuum section 40, but the second vacuum section 40 is always in a vacuum state by the operation of the vacuum pump. Thus, the inner pressure of each of the deposition chambers 78 can be independently changed without interfering with each other. The change in the vapor pressure of the diisocyanate vapor and diamine vapor in any one of the deposition chambers 78 will not affect the vapor pressure of the diisocyanate vapor and diamine vapor in any other one of the deposition chambers 78.

Accordingly, even if the evaporation rate of the diisocyanate and diamine in the first and second evaporation sources 86a, 86b of any one of the monomer vapor suppliers 84 is changed and the vapor pressure of the diisocyanate vapor and the diamine vapor in the deposition chamber 78 thereof is changed, it is effectively prevented that the vapor pressure of the diisocyanate vapor and the diamine vapor in the deposition chamber 78 of any other one of the monomer vapor suppliers 84 is immediately changed and the evaporation rate of the diisocyanate and diamine in the first and second evaporation sources 86a, 86b is changed. In addition, the first and second heaters 90a, 90b of the respective monomer vapor suppliers 84 are controlled for each of the monomer vapor suppliers 84. Thus, the evaporation rate of diisocyanate and diamine in the entire production apparatus 22 is closely controlled.

In the case where the production apparatus in accordance with the first embodiment is used, unlike the conventional production apparatus including only one monomer vapor supplier, even if the evaporation rate of diisocyanate and diamine in any one of the monomer vapor suppliers 84 is changed, the deposition rate or the composition of the vapor-deposited polymer film 16 that is formed on the metallized film 15 in the production apparatus 22 is not changed.

Then, the laminated body 10 including the vapor-deposited polymer film 16 formed on the metallized film 15 by the above-described vapor deposition polymerization operation is sent from the second vacuum section 40 to the first vacuum section 38 along with the rotation of the can roller 35. Thereafter, electron beam is irradiated by the electron beam gun for hardening 60 on the laminated body 10 wound on the can roller 35.

Thus, the polyurea resin constituting the vapor-deposited polymer film 16 of the laminated body 10 is surely hardened. As described above, the inside of the first vacuum section 38 is in a sufficiently low vacuum degree. As a result, the vapor-deposited polymer film 16 is surely and stably hardened by the electron beam gun for hardening 60. Further, the irradiation of the electron beam by the electron beam gun for hardening 60 accelerates the polymerization of diisocyanate and diamine deposited on the metallized film 15. As a result, the quality of the vapor-deposited polymer film 16 is improved.

Then, the laminated body 10 sent from the can roller 35 is passed through the ion bombardment treatment device 62. During passing through the ion bombardment treatment device 62, the laminated body 10 is neutralized. Thereafter, the laminated body 10 is sent to the auxiliary chamber 28 and taken up by the take up roller 48. As a result, a film roll 94 including the wound laminated body 10 having the structure shown in FIG. 1 is obtained.

Accordingly, in the production apparatus 22 for producing the laminated body 10, which is in accordance with the present invention, even if the pressure in the second vacuum section 40 or the evaporation rate of the diisocyanate and diamine in any one of the monomer vapor suppliers 84 is varied in some degree, it can be advantageously prevented that the deposition rate or the composition of the vapor-deposited polymer film 16 which is formed on the metallized film 15 is immediately changed due to such a variation.

The production apparatus 22 in accordance with the first embodiment enables stable production of the laminated body 10 in which the vapor-deposited polymer film 16 that has a uniform composition and thickness is formed on the metallized film 15.

Further, since the production apparatus 22 in accordance with the first embodiment effectively eliminates the variation in the composition or the thickness of the vapor-deposited polymer film 16, there is no need to provide costly devices in the vacuum chamber 24 in order to check the composition or thickness of the vapor-deposited polymer film 16 during the vapor deposition polymerization operation. In addition, after the production of the intended laminated body 10, subsequent operations such as removal of the vapor-deposited polymer film 16 deposited on the devices are not required.

Furthermore, in the production apparatus 22 in accordance with the first embodiment, the metallized film 15 is in close contact with the can roller 35 by the electron beam irradiation with the electron beam gun for charging 58. Thus, it is effectively prevented that the metallized film 15 gets wrinkled during traveling along with the rotation of the can roller 35.

Under a vacuum atmosphere, the metallized film 15 is surely cooled by the can roller 35 that is cooled by the cooling mechanism 54, because the metallized film 15 is in close contact with the can roller 35. Accordingly, the metallized film 15 is not deformed by the diisocyanate vapor and the diamine vapor having a high temperature. Further, the desorption frequency of the diisocyanate vapor and diamine vapor attached to the metallized film 15 can be effectively reduced, whereby the vapor deposition polymerization of the diisocyanate vapor and the diamine vapor can be more efficiently carried out. In addition, the vapor deposition polymerization of the diisocyanate vapor and the diamine vapor can be effectively assisted by the energy provided by the electron beam irradiated on the metallized film 15.

As a consequent of the above, the deposition rate of the vapor-deposited polymer film 16 is effectively improved. The improvement of the deposition rate is further enhanced by the combination of the above-described efficient cooling effect of the metallized film 15, the effect obtained by the electron beam irradiation onto the metallized film 15 by the electron beam gun for charging 58, and the above-described effect obtained by the small gap 75 between the vapor outlet 66 and the can roller 35. Specifically, for example, in the case where the vapor-deposited polymer film 16 having a thickness of 3 μm is formed on the metallized film 15 having the width of 650 nm, the intended laminated body 10 is formed at a rate of 150 m/min.

In the production apparatus 22 in accordance with the first embodiment, the laminated body 10 is neutralized by the ion bombardment treatment device 62 and taken up to form the film roll 94. Thus, the laminated body 10 can be more smoothly unwound from the film roll 94 in subsequent process.

Figure 5:
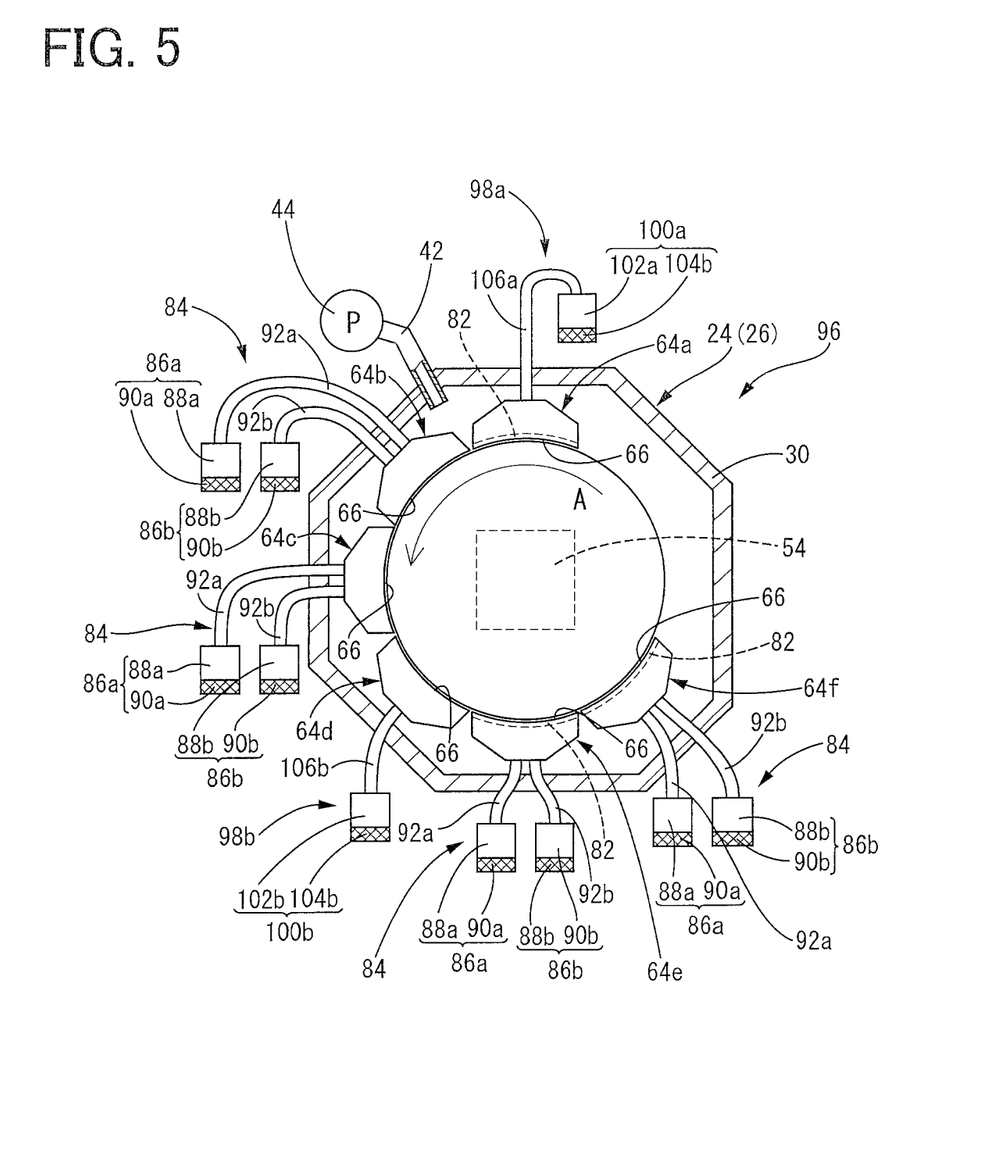
FIG. 5 is a view corresponding to FIG. 2 and showing another embodiment of an apparatus for producing a laminated body of the present invention.

Then, FIG. 5 shows a second embodiment of the apparatus for producing a laminated body that is in accordance with the present embodiment. A production apparatus 96 of the second embodiment has a structure that can produce the laminated body 10 without using the metallized film 15. The laminated body 10 produced by the production apparatus 96 includes, by reference to FIG. 1, a first vapor-deposited polymer film 16 in place of the resin film, a metallized film 14a, 14b formed on each surface of the first vapor-deposited polymer film 16, and a second vapor-deposited polymer film 16 formed on the metallized film 14a at the side opposite to the first vapor-deposited polymer film 16 side. Hereinafter, the structure of the production apparatus 96 in accordance with the present embodiment is explained. With respect to the embodiment shown in FIG. 5, the same reference numerals as used in FIG. 2 are used for members and portions having the same structures as those of the first embodiment shown in FIG. 2, and a detailed explanation of which is dispensed with.

Specifically, as apparent from FIG. 5, in the production apparatus 96 in accordance with the second embodiment, the vacuum chamber 24 only has the main chamber 26. The vacuum chamber 24 can be in a vacuum state by the vacuum pump 44 that is connected to the end of one exhaust pipe 42.

In the vacuum chamber 24, the can roller 35 including the cooling mechanism 54 is rotatably provided. Around the can roller 35, six blowoff members 64a, 64b, 64c, 64d, 64e, 64f are provided so as to be in line in the circumferential direction of the can roller 35. Although not shown in the drawing, the six blowoff members 64a, 64b, 64c, 64d, 64e, 64f have the same structure as the blowoff members 64 provided in the production apparatus 22 of the first embodiment, i.e., the mixing chamber 76 and the deposition chamber 78 are provided in the respective blowoff members 64. However, the shield bar 82 is not provided in the vapor outlet 66 of each of the blowoff members 64b, 64c, 64d.

At the outside of the vacuum chamber 24, four monomer vapor suppliers 84, 84, 84, 84 and first and second metal vapor suppliers 98a, 98b as a metal vapor supply means are provided. The four monomer vapor suppliers 84, 84, 84, 84 have the same structure as those provided in the production apparatus 22 of the first embodiment.

The first metal vapor supplier 98a and the second metal vapor supplier 98b have the same structure and are provided with evaporation sources 100a, 100b, respectively. The evaporation sources 100a, 100b of the first and second metal vapor suppliers 98a, 98b include, respectively, evaporation material containers 102a, 102b that contain evaporation material including aluminum, which is a formation material of the metal deposition films 14a, 14b of the intended laminated body 10, and heaters 104a, 104b for heating and evaporating the evaporation materials in the evaporation material containers 102a, 102b. The material of the evaporation source is suitably changed depending on the material of the metal deposition films 14a, 14b. Further, as the heaters 104a, 104b, an electric heater, an infrared heater, or an electron irradiation heater is suitably used, for example.

The evaporation material containers 102a, 102b of the evaporation sources 100a, 100b respectively constituting the first and second metal vapor suppliers 98a, 98b are connected to the respective blowoff members 64a, 64d in the vacuum chamber 24 so as to communicate with each other through the respective metal vapor supply pipes 106a, 106b as communication passages. The blowoff member 64a connected to the first metal vapor supplier 98a and the blowoff member 64d connected to the second metal vapor supplier 98b are positioned so as to have two of the blowoff members 64b, 64c therebetween at one side in the circumferential direction of the can roller 35 and two of the blowoff members 64e, 64f therebetween at the other side in the circumferential direction of the can roller 35.

The evaporation materials contained in the evaporation material containers 102a, 102b of the first and second metal vapor suppliers 98a, 98b are heated by the heaters 104a, 104b and evaporated to be metal vapor, and the metal vapor is supplied into the blowoff members 64a, 64b through the metal vapor supply pipes 106a, 106b. Further, the metal vapor supplied into the blowoff members 64a, 64b are blown off from the vapor outlets 66, 66 onto the outer peripheral surface of the can roller 35.

In the production of the intended laminated body by the above-described apparatus 96, the following procedure is conducted, for example.

Initially, the cooling mechanism 54 built in the can roller 35 is activated to cool the outer peripheral surface of the can roller 35. At the same time, the vacuum pump 44 is activated to reduce the pressure in the first vacuum section 38. The cooling temperature of the outer peripheral surface of the can roller 35 is adjusted to be the same temperature as in the case where the laminated body 10 is obtained by using the production apparatus 22 of the first embodiment. In addition, the pressure of the first vacuum section 38 is controlled to be about $10^{-4}$ to 100 Pa.

Then, the can roller 35 is rotated in the direction indicated by an arrow A in FIG. 5. Thereafter, the diisocyanate vapor and the diamine vapor are supplied to four of the blowoff members 64b, 64c, 64e, 64f from the four of the monomer vapor suppliers 84, 84, 84, 84, and blown off onto the outer peripheral surface of the can roller 35 through the respective vapor outlets 66 of the blowoff members 64b, 64c, 64e, 64f. At the same time, the metal vapor is supplied to two of the blowoff members 64a, 64d from the first and second metal vapor suppliers 98a, 98b, and blown off onto the outer peripheral surface of the can roller 35 through the respective vapor outlets 66 of the blowoff members 64a, 64d. As a result, along with the rotation of the can roller 35, the metal deposition film 14b, the vapor-deposited polymer film 16, the metal deposition film 14a, and the vapor-deposited polymer film 16 are formed in sequence on the outer peripheral surface of the can roller 35 in the order of the description.

Specifically, the metal vapor blown off from the vapor outlet 66 of the blowoff member 64a connected to the first metal vapor suppliers 98a is deposited on the outer peripheral surface of the can roller 35. Thus, the metal deposition film 14b is directly formed on the outer peripheral surface of the can roller 35.

At this time, since the shield bar 82 is provided at the vapor outlet 66 of the blowoff member 64a, the metal vapor is not deposited on the middle area in the width direction of the can roller 35. Further, the dimension of the vapor outlet 66 of the blowoff member 64a, which corresponds to the width direction of the outer peripheral surface of the can roller 35, is smaller than the width of the outer peripheral surface of the can roller 35 by a predetermined dimension. Thus, the metal vapor is also not deposited on both end portions in the width direction of the outer peripheral surface of the can roller 35. Further, at the middle area and the both end portions in the width direction of the can roller 35, oil margin is formed by an oil margin formation apparatus (which is not shown), for example, before the formation of the metal deposition film 14b. As a result, it can be prevented that, in the formation of the first vapor-deposited polymer film 16 on the metal deposition film 14b, the first vapor-deposited polymer film 16 is directly formed on the middle area and the both end portions in the width direction of the can roller 35 and each of the first margins 18 is filled with the first vapor-deposited polymer film 16.

Then, the diisocyanate vapor and the diamine vapor blown off from the vapor outlet 66 of each of the two blowoff members 64b, 64c are polymerized on the metal deposition film 14b. Thus, in place of the resin film (12), the first vapor-deposited polymerization film 16 is formed on the metal deposition film 14b. In other words, in the second embodiment, the film substrate is constituted by the first vapor-deposited polymer film 16. Further, two of the monomer vapor suppliers 84, 84 and two of the blowoff members 64b, 64c constitute the film substrate supply means.

Then, the metal vapor blown off from the vapor outlet 66 of the blowoff member 64d connected to the second metal vapor supplier 98b is deposited on the first vapor-deposited polymer film 16. As a result, the metal deposition film 14a is formed on the vapor-deposited polymer film 16.

Then, the diisocyanate vapor and the diamine vapor blown off from the vapor outlet 66 of each of the two blowoff members 64e, 64f are polymerized on the metal deposition film 14a. Thus, the second vapor-deposited polymerization film 16 is formed on the metal deposition film 14a. Since the shield bar 82 is provided at the vapor outlet 66 of the respective blowoff members 64e, 64f, the diisocyanate vapor and the diamine vapor are not deposited on the middle area in the width direction of the metal deposition film 14a. Consequently, the second margin 20 is formed on the middle area in the width direction of the metal deposition film 14a.

Further, here, the dimension of the vapor outlet 66 of each of the blowoff members 64e, 64f and the blowoff member 64d for blowing out the metal vapor, which corresponds to the width direction of the outer peripheral surface of the can roller 35, is smaller than the width of the outer peripheral surface of the can roller 35 by a predetermined dimension. Consequently, the first margin 18 is formed on both sides in the width direction of the vapor-deposited polymer film 16.

Consequently, the laminated body 10 including in sequence the metal deposition film 14b, the first vapor-deposited polymer film 16, the metal deposition film 14a, and the second vapor-deposited polymer film 16 is obtained. Then, the obtained laminated body 10 is taken out from a part of the outer peripheral of the can roller 35 that is positioned between two blowoff members 64a, 64f adjacent to each other in the circumferential direction of the can roller 35, thereby continuously obtaining the intended laminated body 10.

As described above, the production apparatus 96 of the second embodiment enable easy and effective production of the intended laminated body 10, without preparation of the metallized film 15 in advance.

In the production apparatus 96, the diisocyanate vapor and the diamine vapor to be blown off from the vapor outlet 66 of the respective blowoff members 64 provided in the vacuum chamber 24 are polymerized in the deposition chamber 78 of the respective blowoff members 64 to form the vapor-deposited polymer film 16. Accordingly, the second embodiment can have substantially the same advantages as those of the first embodiment.

It is to be understood that, although the metal deposition film 14b is formed on the outer peripheral surface of the can roller 35 in this embodiment, the metal deposition film 14b may be omitted. In such a case, the first vapor-deposited polymer film 16 may be directly formed on the outer peripheral surface of the rotary drum 35.

Further, in the production apparatus 96 of the second embodiment, the electron beam gun for hardening (60) may be provided at a position between the blowoff member 64c and the blowoff member 64d and/or at a position next to the blowoff member 64f that is opposite to the blowoff member 64e side. The first and second vapor-deposited polymer films 16, 16 may be hardened by the electron beam irradiated from the electron beam gun for hardening (60).

While the specific embodiment of the present invention has been described in detail, for illustrative purpose only, it is to be understood that the present invention is not limited to the details of the illustrated embodiments.

For example, in the first and second embodiments, the heating temperature of diisocyanate and diamine in the first and second evaporation sources 86a, 86b of the respective monomer vapor suppliers 84 is controlled to be the same. However, the respective monomer vapor suppliers 84 may have respective target heating temperatures of diisocyanate and diamine. In such a case, the evaporation rate of the diisocyanate and diamine in the respective monomer vapor suppliers 84 can be slightly varied. As a result, during one rotation of the can roller 35, the thickness of the vapor-deposited polymer film 16 formed on the metallized film 15 can be gradually and effectively made larger. Consequently, without increasing the pressure resistance of the vacuum chamber 24, the laminated body 10 including the thick vapor-deposited polymer film 16 can be easily and effectively produced at a low cost.

Further, in the case where the evaporation rate of diisocyanate and diamine in the respective monomer vapor suppliers 84 is made equal, during one rotation of the can roller 35, the thickness of the vapor-deposited polymer film 16 formed on the metallized film 15 can be gradually and effectively made larger.

A kind of the monomer vapor supplied from the respective monomer vapor suppliers 84 may be varied. As a result of this, during one rotation of the can roller 35, the vapor-deposited polymer film 16 of different kind can be formed on the metallized film 15. Consequently, the laminated body 10 including the vapor-deposited polymer films 16 of different kinds can be easily and effectively produced at a low cost.

The number of the blowoff members 64 is not limited to the number exemplified in the first or second embodiment. It is only necessary to have at least two blowoff members 64 in order to form one vapor-deposited polymer film 16.

In the first and second embodiments, one monomer vapor supplier 84 as a monomer vapor supply means is connected to one blowoff member 64. However, it is possible to connect one monomer vapor supplier 84 to a plurality of blowoff members 64. That is, it is only necessary to have at least one monomer vapor supplier 84.

The metallized film 15 as a film substrate is not necessarily charged before the formation of the vapor-deposited polymer film 16. However, in the case where the metallized film 15 is charged, instead of the exemplified electron beam gun for charging 58, a contact-type apparatus that contacts and charges the metallized film 15, for example, a conductive roller that is connected to an external power source, may be used. Further, in the case where such an apparatus for charging is used, a neutralization apparatus is required. In place of the ion bombardment treatment device 62, any conventional neutralization apparatus having a known structure may be suitably used.

The electron beam gun for hardening 60 that hardens the vapor-deposited polymer film 16 is not essential and may be used as necessary. Instead of the electron beam gun for hardening 60, an infrared irradiation apparatus or UV irradiation apparatus may be used as an apparatus for hardening the vapor-deposited polymer film 16, for example.

The position of the shield bar 82 as a shielding member may be suitably changed depending on the position of the second margin 20 of the vapor-deposited polymer film 16. The shield bar 82 may be formed at any position as long as it extends across the vapor outlet 66 in the circumferential direction of the can roller 35 as a rotary drum. The shield bar 82 may be fixedly provided at the member other than the blowoff member 64, if possible.

In addition, although in the first and second embodiments, the specific example is shown in which the present invention is applied to the apparatus for producing a laminated body constituting the film capacitor element, it is to be understood that the present invention may be advantageously applied to any apparatus for producing a laminated structure in which at least one vapor-deposited polymer film is formed on the film substrate by the vacuum vapor deposition polymerization process.

Although further details will not be described herein, it is to be understood that the present invention may be embodied with various other changes and modifications which may occur to those skilled in the art, without departing from the spirit and scope of the invention.

The invention claimed is:

1. An apparatus for producing a laminated body including a film substrate and at least one vapor-deposited polymer film deposited on the film substrate by a vacuum deposition polymerization, the apparatus comprising:
    a vacuum chamber;
    an exhaust means that exhausts an air from the vacuum chamber to make the vacuum chamber in a vacuum state;
    a rotary drum that is rotatably provided in the vacuum chamber, the rotary drum having an outer peripheral surface on which the film substrate is provided so as to be in contact therewith, whereby the film substrate is allowed to be traveled in the circumferential direction along with the rotation of the rotary drum;
    a film substrate supply means that supplies the film substrate on the outer peripheral surface of the rotary drum;
    a plurality of blowoff members positioned around the rotary drum so as to be in line with each other in the circumferential direction, each of the plurality of blowoff members including a vapor outlet that opens inside the vacuum chamber to the outer peripheral surface of the rotary drum and an inner space that is defined by a cover wall;
    a plurality of deposition chambers each constituted by a part of the inner space of each of the plurality of blowoff members and positioned inside the vacuum chamber; and
    at least one monomer vapor supply means including: a plurality of evaporation sources that each generates a kind of monomer vapor, so that a plurality of kinds of monomer vapor are generated, by heating and evaporating respective kinds of material monomer; and a plurality of communication passages that communicate the plurality of evaporation sources with a corresponding one of the plurality of deposition chambers, whereby the plural kinds of monomer vapor are blown off from the vapor outlet of each of the plurality of blowoff members;
    wherein a distance between the vapor outlet of each of the plurality of blowoff members and the outer peripheral surface of the rotary drum is 5 mm or less, and
    an intervening wall is provided to divide the inner space of each of the plurality of blowoff members into a mixing chamber into which the plurality of kinds of monomer vapor are introduced so as to be mixed together therein and the deposition chamber including the vapor outlet, and a communication hole is provided through the intervening wall such that the mixing chamber and the deposition chamber communicate with each other through the communication hole, whereby the plurality of kinds of monomer vapor introduced into the mixing chamber and mixed therein are supplied to the deposition chamber through the communication hole of the intervening wall.

2. The apparatus according to claim 1, wherein one vapor-deposited polymer film is formed by using at least two of the plurality of blowoff members.

3. The apparatus according to claim 1, wherein each of the plurality of blowoff members includes a shielding member for partially shielding the film substrate, the shielding member being provided at the vapor outlet of each of the plurality of blowoff members so as to extend across the vapor outlet in the circumferential direction of the rotary drum, thereby preventing the plural kinds of monomer vapor blown off from the vapor outlet from adhering to a portion of the film substrate that is shielded by the shielding member.

4. The apparatus according to claim 1, further comprising a charging means that charges the film substrate, the charging means being provided at an upper stream side of one of the plurality of blowoff members that is positioned at the upper most stream side in a driving direction of the film substrate on the rotary drum.

5. The apparatus according to claim 4, further comprising a neutralization means that neutralizes the film substrate charged by the charging means, the neutralization means being provided at a down stream side of one of the plurality of blowoff members that is positioned at the down most stream side in a driving direction of the film substrate on the rotary drum.

6. The apparatus according to claim 1, further comprising a hardening means that hardens the vapor-deposited polymer film formed on the film substrate, the hardening means being provided on the down stream side of one of the plurality of blowoff members that is positioned at the down most stream side in a driving direction of the film substrate on the rotary drum.

7. The apparatus according to claim 1, wherein the film substrate has a thickness of 5 μm or less.

8. The apparatus according to claim 1, wherein the at least one vapor-deposited polymer film has a thickness of 10 μm or less.

9. The apparatus according to claim 1, further comprising a metal vapor supply means including an evaporation source that generates metal vapor by heating and evaporating a metal deposition material and a communication passage communicating the evaporation source with a corresponding one of the plurality of deposition chambers, whereby the metal vapor is blown off from the vapor outlet of each of the plurality of blowoff members.

10. The apparatus according to claim 1, wherein the film substrate comprises a metallized film including a polypropylene based biaxially stretched film and a metal deposition film formed on at least one surface of the polypropylene based biaxially stretched film.

11. The apparatus according to claim 1, wherein the film substrate comprises a metallized film including a polyethylene terephthalate based biaxially stretched film and a metal deposition film formed on at least one surface of the polyethylene terephthalate based biaxially stretched film.

12. The apparatus according to claim 1, wherein the film substrate supply means comprises a feeding device, the feeding device being arranged to supply the film substrate on the outer peripheral surface of the rotary drum by unwinding the film substrate from a roll of the film substrate.

13. The apparatus according to claim 12, wherein at least one partition wall is provided in the vacuum chamber such that the vacuum chamber is separated into a first section in which the feeding device is provided and a second section in which the plurality of blowoff members are provided, thereby allowing an inner pressure of each of the sections to be changed independently.

14. The apparatus according to claim 1, wherein the at least one monomer vapor supply means comprises a plurality of monomer vapor supply means, the plural kinds of monomer vapor being supplied into at least one of the plurality of deposition chambers from least one of the plurality of monomer vapor supply means and blown off from the vapor outlet to be polymerized on the outer peripheral surface of the rotary drum, thereby forming the film substrate comprising a vapor-deposited polymer film substrate on the outer peripheral surface of the rotary drum.

* * * * *